(12) United States Patent
Schaefer

(10) Patent No.: US 7,330,382 B2
(45) Date of Patent: Feb. 12, 2008

(54) PROGRAMMABLE DQS PREAMBLE

(75) Inventor: Scott Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 10/929,282

(22) Filed: Aug. 30, 2004

(65) Prior Publication Data

US 2005/0024972 A1 Feb. 3, 2005

Related U.S. Application Data

(62) Division of application No. 10/210,483, filed on Aug. 1, 2002, now Pat. No. 6,819,599.

(51) Int. Cl.
*G11C 7/00* (2006.01)

(52) U.S. Cl. ............... 365/193; 365/194; 365/189.07; 365/233

(58) Field of Classification Search ............... 365/193, 365/194, 189.07, 233
See application file for complete search history.

(56) References Cited

U.S. PATENT DOCUMENTS

| | | | |
|---|---|---|---|
| 5,457,659 A | 10/1995 | Schaefer | 365/222 |
| 6,061,292 A | 5/2000 | Su et al. | 365/230 |
| 6,240,042 B1* | 5/2001 | Li | 365/233 |
| 6,381,194 B2 | 4/2002 | Li | 365/233 |
| 6,392,946 B1 | 5/2002 | Wu et al. | 365/219 |
| 6,407,963 B1* | 6/2002 | Sonoda et al. | 365/233.5 |
| 6,512,704 B1* | 1/2003 | Wu et al. | 365/189.07 |
| 6,552,955 B1* | 4/2003 | Miki | 365/233 |
| 6,570,944 B2* | 5/2003 | Best et al. | 375/355 |
| 6,600,681 B1* | 7/2003 | Korger et al. | 365/193 |
| 6,603,706 B1* | 8/2003 | Nystuen et al. | 365/233 |
| 6,605,969 B2* | 8/2003 | Mikhalev et al. | 327/158 |
| 6,615,345 B1* | 9/2003 | LaBerge | 713/100 |

(Continued)

FOREIGN PATENT DOCUMENTS

JP 06-284121 10/1994

(Continued)

OTHER PUBLICATIONS

"1GB, 2GB (x72) 184-Pin Registered DDR SDRAM Dimms", *Micron Technology Inc.*, pp. 1-29.

*Primary Examiner*—Viet Q. Nguyen
(74) *Attorney, Agent, or Firm*—Schwegman, Lundberg & Woessner, P.A.

(57) ABSTRACT

A method and apparatus for programming a data strobe (DQS) preamble in a memory by loading a defined set of bits into one or more registers of the memory, where one or more bits are formatted specifically for enabling the data strobe preamble. At least one of the bits is used to enable a data strobe preamble as either a default data strobe preamble of the memory or as a reduced data strobe preamble with a time length set equal to a fraction of the default preamble or a fraction of a clock cycle. The enabling bit can be used to provide a input for generating a delay that provides a delayed signal to drivers of the memory for producing a reduced data strobe preamble and for sequencing or driving data to be read out of the memory. The reduced data strobe preamble can also be used for writing data into the memory.

29 Claims, 6 Drawing Sheets

U.S. PATENT DOCUMENTS

| | | | |
|---|---|---|---|
| 6,621,315 B2 * | 9/2003 | Heo et al. | 327/158 |
| 6,625,702 B2 * | 9/2003 | Rentschler et al. | 711/154 |
| 6,680,866 B2 * | 1/2004 | Kajimoto | 365/189.01 |
| 6,681,301 B1 * | 1/2004 | Mehta et al. | 711/154 |
| 6,693,472 B2 * | 2/2004 | Mikhalev et al. | 327/149 |
| 6,714,464 B2 * | 3/2004 | Bhatia et al. | 365/194 |
| 6,715,096 B2 * | 3/2004 | Kuge | 713/600 |
| 6,777,976 B2 * | 8/2004 | Kuge | 326/30 |
| 6,814,945 B2 * | 11/2004 | Kawakami et al. | 422/219 |
| 6,819,151 B2 * | 11/2004 | Mikhalev et al. | 327/141 |
| 6,819,599 B2 * | 11/2004 | Schaefer | 365/189.07 |
| 6,836,503 B2 * | 12/2004 | Best et al. | 375/355 |
| 6,990,562 B2 * | 1/2006 | Rentschler et al. | 711/154 |
| 7,002,378 B2 * | 2/2006 | Srikanth et al. | 327/50 |
| 7,103,126 B2 * | 9/2006 | Joo et al. | 375/354 |
| 2002/0091958 A1 | 7/2002 | Schoenfeld et al. | 713/401 |
| 2002/0122348 A1 | 9/2002 | Lee et al. | 365/233 |
| 2003/0002316 A1 * | 1/2003 | Morita et al. | 365/63 |
| 2003/0067812 A1 * | 4/2003 | Kajimoto | 365/189.01 |
| 2006/0007760 A1 | 1/2006 | Schaefer | |

FOREIGN PATENT DOCUMENTS

| | | |
|---|---|---|
| JP | 406284121 A | 10/1994 |
| JP | 407177552 A * | 7/1995 |
| JP | 410155002 A * | 6/1998 |
| JP | 411008872 A * | 1/1999 |
| JP | 411025029 A * | 1/1999 |
| JP | 02003173290 A * | 6/2003 |
| JP | 02004103061 A * | 4/2004 |

* cited by examiner

PROGRAMMABLE DQS PREAMBLE

This application is a Divisional of U.S. application Ser. No. 10/210,483, filed Aug. 1, 2002, now U.S. Pat. No. 6,819,599, which is incorporated herein by reference.

FIELD OF THE INVENTION

The present invention relates to memory devices. In particular it relates to data strobe (DQS) signals that follow read and write commands in double data rate operations.

BACKGROUND OF THE INVENTION

According to design convention, memory devices, such as DRAMs and SDRAMs, include a double data rate (DDR) transfer capability. DDR uses both the leading and falling edges of a clock signal when transferring data during read and write operations. Operating a DDR typically adheres to standards set by JEDEC, once known as the Joint Electron Device Engineering Council. As defined by JEDEC standards, after the issuance of a read and/or write command, a data strobe (DQS) signal, generated by the memory for indicating the availability of data, changes to a logic low for a full clock period ($t_{CK}$) preceding the transfer of data. It is commonly known as the DQS preamble and its associated tolerance ranges from 0.9 to 1.1 of the clock period. Thereafter, data is transferred with each rising and falling edge of the DQS signal.

In a memory module having multiple memory devices, each memory device has its own DQS line coupled to a controller. A timing problem can arise, however, when DQS signals between more than one memory device simultaneously compete for controlling data transfer on the data bus. In some instances this might even lead to a corruption in data transfer. To illustrate this problem, reference is taken to FIG. 1 where a timing diagram for a fourth to first socket read operation is presented (where the first socket is physically closest to the controller, the second socket is next closest, etc.). It will be appreciated that this problem applies equally to write operations although no explicit example is presented.

In FIG. 1, a clock signal, CK, and its inverse, CK#, provide synchronized clocking control in a memory module having at least four sockets capable of containing memory devices. The CK has six complete periods shown as T0 through the beginning of T7. Dashed lines are shown that correspond to one-half of a clock period. The fourth socket DQS signal corresponds to a read command (not shown) occurring at T0. The first socket DQS signal corresponds to a read command (not shown) occurring at T3. The data signals, DQ, for each read operation of the fourth and the first sockets correspond to a burst length of four data bits, D0, D1, D2 and D3 that are transferred on the data bus with each rising and falling edge of its corresponding DQS signal after the time period of its DQS preamble shown as $t_{RPRE}$ ("RPRE" meaning Read Preamble).

As shown, the time period of the DQS preamble for the 4$^{th}$ socket begins shortly after period T1 while for the 1$^{st}$ socket it begins shortly before T4. The DQS preambles do not both begin at precisely the same position relative to the clock periods due to the +/− time tolerances that can stack up between memory modules. Such tolerances are well known and include, for example, minimum and maximum times for low impedance (LZ), high impedance (HZ), access time (AC), etc. As such, the timing shown is merely illustrative.

Just after time T3n, the DQS signal for the 4$^{th}$ socket begins a transition from logic high to logic low to transfer the fourth and last data bit, D4, on DQ signal line. Midway between such transition, the DQS signal begins the read postamble period as shown by $t_{RPST}$. The time difference between the beginning of $t_{RPST}$ for the 4$^{th}$ socket and the beginning of $t_{RPRE}$ for the 1$^{st}$ socket is shown diagrammatically in FIG. 1 as $0.5 * t_{CK} - t_{DQSCK(max)} - t_{LZ(min)}$. In this expression, $t_{DQSCK(max)}$ is the maximum time for an access window of DQS from a CK/CK# crossover, shown as a time difference between the crossing of CK/CK# and the center of the following transition in DQS from a low to a high. Also, $t_{LZ(min)}$ is the minimum time for data-out low-impedance window of DQ from a CK/CK# crossover, shown as a time difference between the beginning out of data and the following crossing of CK/CK#. It can be seen that the data transfers associated with the DQS signals for these two sockets do not conflict with one another.

As maximum time tolerances are added (stack up), and as the physical distance between sockets increases, there remains only a fixed amount of time before conflicts occur between the data transfers associated with different DQS preambles. For a conventional clock period, $t_{CK}$, of 10 nsec, a memory module has a time margin to prevent conflicting data transfers, so long as the electrical line length (length of time for a signal to propagate between the fourth socket and the first socket) is less than the time margin. In one prior art memory module, the memory module has timing parameters providing a time margin of 3.538 nsec that is defined by the margin equation, $$\text{margin} = \tfrac{1}{2} t_{CK} - t_{DQSCK(max)} - t_{LZ(min)} + \tfrac{1}{2} t_T, \text{ or}$$

$$\text{margin} = \tfrac{1}{2} t_{CK} - \text{Late} - \text{Early},$$

and summarized by the following data in nsec:

TABLE 1

Timing Margin for 4$^{th}$ to 1$^{st}$ Socket Read with a 10 nsec clock, CK, period

| clock | $t_{LZ(min)}$ | $t_{DQSCK(max)}$ | ½ $t_{Tmaxslew}$ | Early | Late | margin |
|---|---|---|---|---|---|---|
| 10 | 0.8 | 0.8 | 0.138 | 0.8 | 0.662 | 3.538 | where $\tfrac{1}{2} t_T = \tfrac{1}{2} t_{Tmaxslew}$ is one-half of the time to completely transition a signal from a logic high to a logic low, or vice versa; where Early is an early signal with favorable (best case) tolerance stack up, such that, early=$t_{LZ(min)}$; and Late is a late signal with unfavorable (worst case) tolerance stack up, such that, late=$t_{DQSCK(max)} - \tfrac{1}{2} t_T$.

As clock periods become ever shorter as clocking frequencies increase, the margin correspondingly decreases. As shown in Table 2, the margin is 2.388 nsec for a 7.5 nsec clock period and 1.938 nsec for a 6 nsec clock period.

TABLE 2

Timing Margin for 4$^{th}$ to 1$^{th}$ Socket Read with 7.5 and 6 nsec clock periods

| clock | $t_{LZ(min)}$ | $t_{DQSCK(max)}$ | ½ $t_{Tmaxslew}$ | early | late | margin |
|---|---|---|---|---|---|---|
| 7.5 | 0.75 | 0.75 | 0.138 | 0.75 | 0.612 | 2.388 |
| 6 | 0.6 | 0.6 | 0.138 | 0.6 | 0.462 | 1.938 |

(All units are in nsec, and all definitions are the same as the previous table.)

Once again, provided the electrical line length (in time) is short enough, conflicting data transfers associated with different DQS preamble signals will not occur. But some conventional memory modules already cannot accommodate a 7.5 nsec period clock because their electrical line length between the $4^{th}$ and $1^{st}$ socket (in terms of the time it takes to propagate signals) exceeds 2.388 nsec.

As such, the memory device arts are desirous of memories capable of accommodating faster clocking frequencies without having to facilitate redesigned electrical line lengths.

DETAILED DESCRIPTION OF THE PREFERRED EMBODIMENTS

In the following detailed description of the preferred embodiments, reference is made to the accompanying drawings which form a part hereof, and in which is shown by way of illustration, specific embodiments in which the inventions may be practiced. These embodiments are described in sufficient detail to enable those skilled in the art to practice the invention, and it is to be understood that other embodiments may be utilized and that process, electrical, or mechanical changes may be made without departing from the scope of the present invention. The following detailed description is, therefore, not to be taken in a limiting sense, and the scope of the present invention is defined only by the appended claims and their equivalents.

Figure 1:
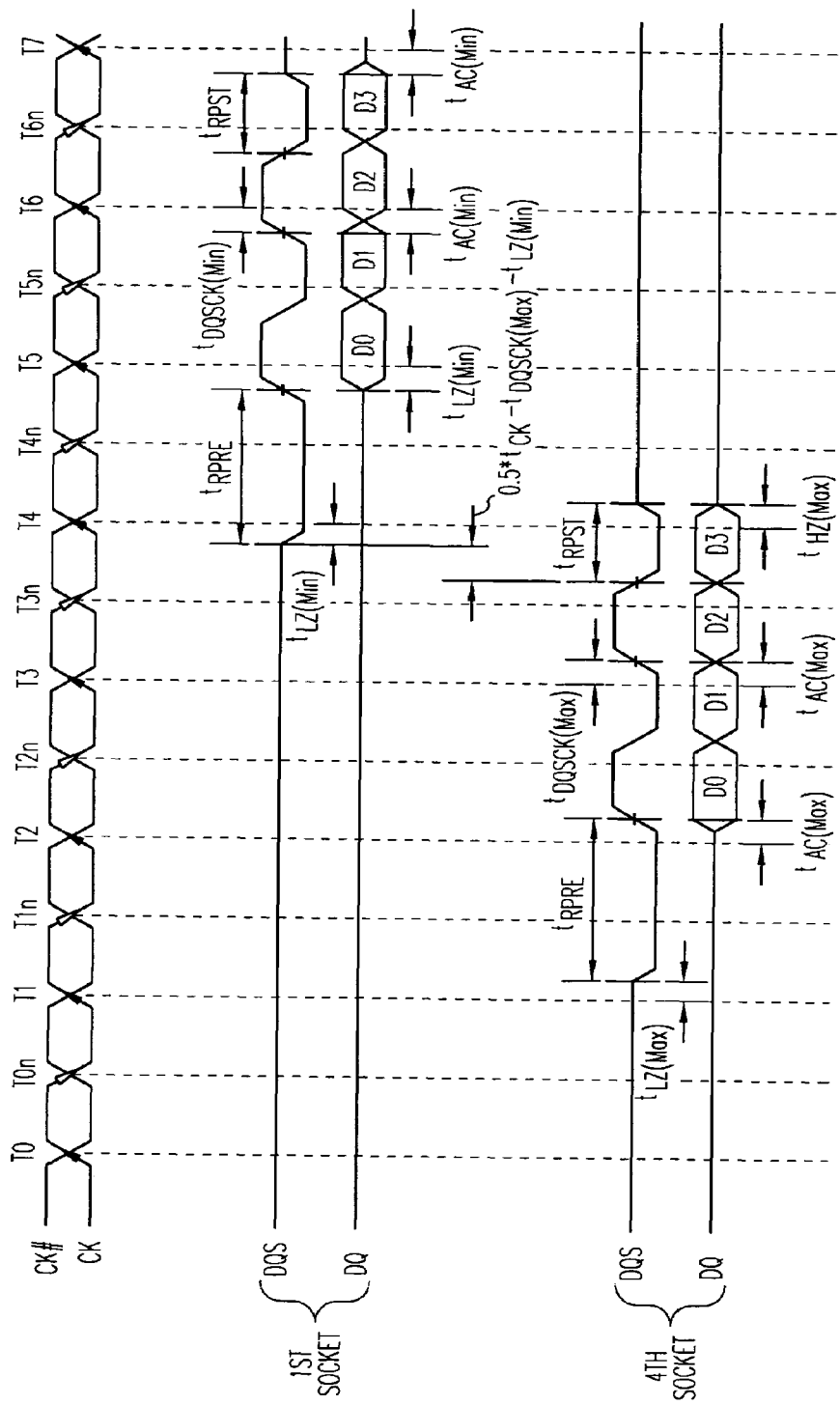
FIG. 1 shows a timing diagram in accordance with the prior art for a fourth to first socket read operation.

In the following embodiments to be discussed, a data strobe (DQS) preamble is reduced by reducing the DQS preamble window by delaying the beginning of the preamble. Referring to the $4^{th}$ socket of FIG. 1, the DQS preamble is reduced through shortening $t_{RPRE}$ by delaying the beginning of $t_{RPRE}$, which corresponds to lengthening or increasing $t_{LZ(Max)}$. For instance, for the $4^{th}$ socket, $t_{RPRE}$ begins shortly after T1. By beginning $t_{RPRE}$ shortly after T1n, the DQS preamble for the memory of the $4^{th}$ socket is reduced.

In accordance with one embodiment of the present invention, a method is provided for programming a data strobe (DQS) preamble in a memory by loading a defined set of bits into one or more registers of the memory, where the bits are formatted specifically for enabling the data strobe preamble. At least one of the bits is used to enable a data strobe preamble as either a default data strobe preamble of the memory or as a reduced data strobe preamble with a time length set equal to a fraction of the default preamble, a specified time length, or a fraction of a clock cycle. Further, a data strobe preamble is reduced by reducing a preamble window by delaying the beginning of the data strobe preamble.

In one embodiment, a memory includes one or more registers for receiving a set of bits. The set of bits includes one or more bits formatted for programming a DQS preamble in the memory. The DQS enabling bit is used by the memory to provide input to a delay element for generating a delay that provides a delayed signal to drivers of the memory. Using the delay signal, the drivers produce a DQS preamble, having a reduced time length, and sequence or drive data to be read out of the memory. The memory also uses the reduced DQS for writing data into the memory.

System

Figure 2:
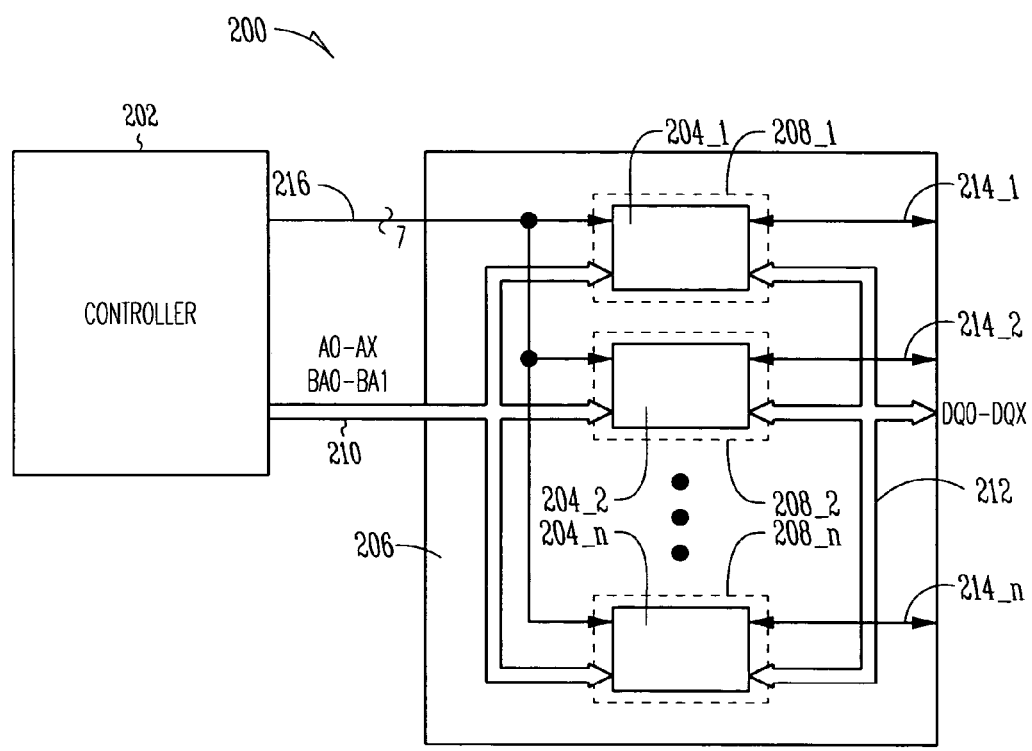
FIG. 2 shows a block diagram of an embodiment of a system including a controller and multiple memories, according to the teachings of the present invention.

FIG. 2 shows a block diagram of an embodiment of a system 200 including a controller 202 and multiple memory devices 204_1-204_n, according to the teachings of the present invention. The controller 202 is coupled to a memory module 206 that includes sockets or slots 208_1-208_n for receiving memory devices 204_1-204_n. The number of memory devices generally depends upon the bus width employed. The memory module 206 can be one of several memory modules positioned in several sockets in system 200 under the management of controller 202. It provides electrical communication to the memory devices 204_1-204_n from controller 202. The memory devices 204_1-204_n are coupled to an address bus 210, a data bus 212, and each has a DQS line 214_1-214_n, respectively.

Controller 202 provides command signals over lines 216. In one embodiment, lines 216 includes seven control lines. In other embodiments, the number of control lines for lines 216 depends on the number of control signals needed for the particular memory module 206 used for the embodiment of system 200. Controller 202 also provides information for programming a DQS preamble on address bus 210. In another embodiment, controller 202 provides the information for programming a DQS preamble on data bus 212 in addition to providing data on data bus 212 (for convenience, data bus 212 is not shown as connected to controller 202). Controller 202 can be a processor such as in a computer, a intermediate device between a processor and a memory for providing a special set of instructions such as those used for memory initialization, or a control device that initiates system startup.

In one embodiment, controller 202 manages the timing margin for placing data on data bus 212 associated with multiple memory modules located in sockets at different physical distances from controller 202. In one method for managing the timing margin, controller 202 programs a DQS preamble associated with each memory devices 204_1-204_n.

At initialization, controller 202 configures memory devices 204_1-204_n with information regarding their operating parameters. For instance, controller 202 programs a mode register in each memory device 204_1-204_n with its burst length, burst type, CAS latency, and operating mode. As is known, the burst length determines the maximum number of column locations that can be accessed for a given read or write command. Typically, the burst type is either sequential or interleaved, and the CAS latency is the number of clock cycles between the registration of a read command and the availability of the first bit of output data. The operating mode can either be normal operation or normal operation with a reset of the delay lock loop (DLL). Controller 202 is configured to determine and format the information for managing each memory device 204_1-204_n and programs each memory device using a load mode register command. Controller 202 sends the information via address bus 210 to a mode register of each memory devices 204_1-204_n. The format generally follows the standards set by JEDEC.

Control 202 can also program additional information in an extended mode register of each memory device 204_1-204_n such as DLL enable/disable, output drive strength, and a QFC# function for flow control. The format of this information in the extended mode register is specified by JEDEC standards. However, format of other bits representing an operating mode are not specified by JEDEC standards.

In one embodiment, controller 202 programs the extended mode registers within the information for programming the DQS preamble for each memory device 204_1-204_n. The DQS preamble can be programmed by controller 202 individually for each memory device 204_1-204_n, thus allowing the programming of the timing margin for the system 200.

In another embodiment, controller 202 programs other registers for enabling a DQS preamble within each memory device 204_1-204_n via address bus 210. Alternately, controller 202 programs other registers for enabling a DQS preamble within each memory device 204_1-204_n using data bus 212.

System 200 having a controller 202 can be a computer or any other information handling device having multiple memories sharing a data bus.

Memory

Figure 3:
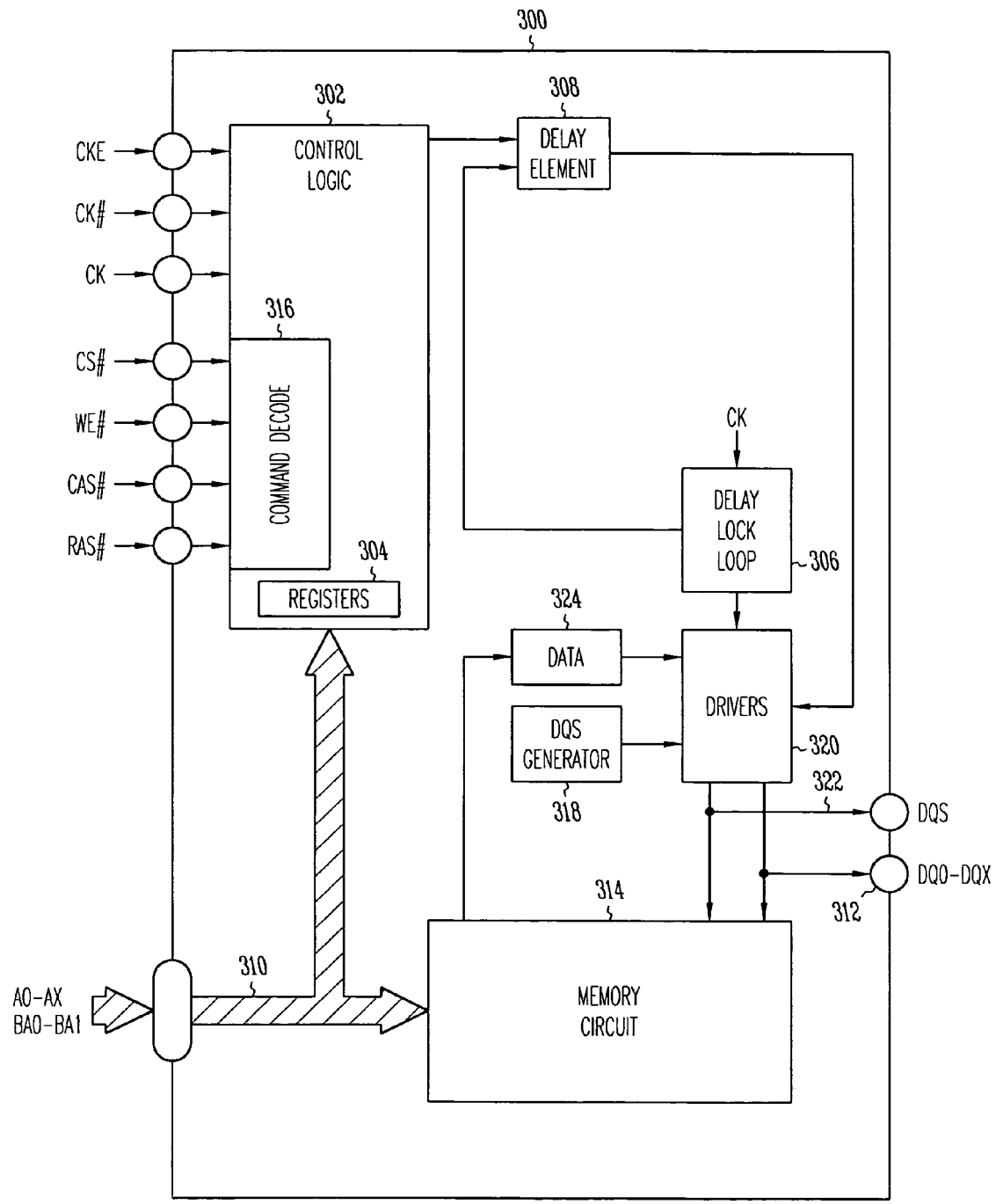
FIG. 3 shows a block diagram of an embodiment of a memory including a control logic, registers, a delay lock loop, and a delay element, according to the teachings of the present invention.

FIG. 3 shows a block diagram of an embodiment of a memory 300 including a control logic 302, registers 304, a delay lock loop or phase lock loop (DLL/PLL) 306, and a delay element 308, according to the teachings of the present invention. For convenience, FIG. 3 does not contain all the elements of a memory, but contains those elements of a memory necessary for understanding the embodiments discussed, as can be appreciated by those skilled in the art. In addition, embodiments are discussed in terms of a delay lock loop, but it is understood that the embodiments can be discussed in terms of a phase lock loop. Delay element 308 has a plurality of inputs and at least one output. One input of delay element 308 is coupled to control logic 302, and a second input of delay element 308 is coupled to DLL 306, where DLL 306 receives the CK signal for providing clocking signals to delay element 308. Control logic 302 uses one or more bits from one or more registers 304 to provide control information to delay element 308 to provide a timing delay that reduces the DQS preamble of memory 300 to a shorter time period than a default value for the DQS preamble.

Memory 300 also includes an address bus 310, a data bus 312, and a memory circuit 314 that contains data stored memory 300. Memory circuit 314 is coupled to address bus 310 for receiving information identifying the location for reading or writing data from data bus 312. The identification of the location is contained in BA0-BA1 for selecting a memory bank and in A0-AX for selecting an address within a memory bank. The management of the read and write operations is performed by control logic 302 upon receiving commands from a processor such as controller 202 of FIG. 2. Memory 300 receives typical command signals such as RAS#, CAS#, WE#, and CS#, as are known by those skilled in the art. These command signals or combination of command signals are interpreted by a command decode 316 in control logic 302 to produce the commands for managing memory 300 in conjunction with differential clock signals, CK and CK#, along with a clock enable, CKE. The read and write operations of memory 300 are controlled with the DQS that is provided by a DQS generator 318 suppling drivers 320 to control the DQS placed on DQS line 322. In addition, the drivers also clock out data 324 received from memory circuit 314 for transferral to data bus 312.

An industry/JEDEC standard DQS preamble is one clock cycle of the memory. However, the DQS preamble can be programmed by controller 202 of FIG. 2 programming one or more registers 304 with bits having a predetermined format. In one embodiment, one of the registers 304 is an extended mode registration, where one bit location is coupled to delay element 308. With the bit high, the delay element 308 is enabled and a delay of one-fourth clock cycle is produced to delay the beginning and time length of the DQS preamble by one-fourth clock cycle. Delay element 308 uses the delay enable bit provided by control logic 302 programmed in registers 304 along with a clock input from the DLL 306 to provide the programmed delay. Delay element 308 contains one or more delay circuits, as are known by those skilled in the art. With delay element 308 coupled to drivers 320, delay element 308 produces the one-fourth clock delay for use by drivers 320. Drivers 320 produce a reduced DQS preamble on the DQS line 322 using a signal from DLL 306, a signal from DQS generator 318, and the delay signal from delay element 308. Alternately, the bit from the extended mode register can be used to enable other delays in delay element 308, where the other delays are for one-half clock cycle, three-fourths clock cycle, or one-tenth clock cycle.

In an alternate embodiment, one or more registers 304 contains multiple bits for programming a DQS preamble, where one bit is used to enable/able delay element 308. The one bit enables a delay in delay element 308. The one bit in a low state does not enable a delay in delay element 308, which maintains the DQS preamble at a default time length equal to one clock cycle. With the enable bit in a high state, the other bits are used to program the length of the delay. For instance, two bits can be used to program a delay with 00 enabling a one-tenth clock cycle delay, 01 enabling a one-fourth clock delay, 10 enabling a half clock delay, and 11 enabling a three-fourths clock delay. In other embodiments delay element 308 provides programmable delays that are other fractions of a clock cycle.

Memory 300, as well as controller 202, can be realized as a single integrated circuit. Memory 300 can be formed on a semiconductor die using a substrate, where the substrate is a material such as silicon, germanium, silicon on sapphire, gallium arsenide, or other commonly used semiconductor material. The elements of memory 300 are fabricated using conventional processing means for forming the various circuits within the semiconductor material and for providing electrical connections for coupling to an address bus, a data bus, and control lines for communication with a controller or a processor.

The various embodiments of memory 300 can be coupled with a controller such as controller 202 of FIG. 2 to form system 200 to provide a system with the ability to manage its timing margins related to operating with multiple memories. Further, system 200 can use one or more controllers having various embodiments of controller 202 to program a DQS preamble for each memory 300 to which it is coupled independent of the other memories.

Data Structure

Figure 4:
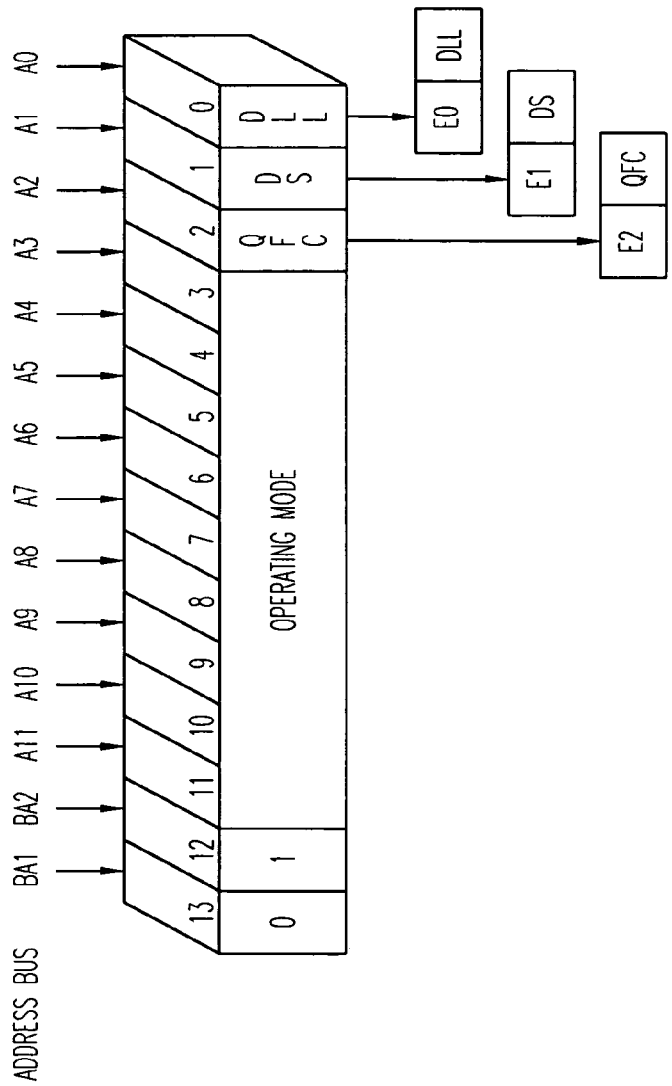
FIG. 4 shows a block diagram of an embodiment for a data structure for a memory, according to the teachings of the present invention.

FIG. 4 shows a block diagram of an embodiment for a data structure for a memory, according to the teachings of the present invention. This data structure uses the structure for an extended mode register. In one embodiment, the extended mode register includes a format having fourteen bits such that the bits can be programmed into a memory such as memory 300 of FIG. 3 using address bus 310. The data structure for the extended mode register includes a format with the three bit locations transferred over A0, A1, and A2 reserved for enabling/disabling DLL, for drive strength, and for QFC. The bits to be transferred over BA1 and BA0 are set it 0 and 1, respectively, for loading the extended mode register. Bit E10 shown in FIG. 4 is used as the bit to enable the programming of the DQS preamble, where the bit for E10 is transferred over address bus 310 in the address location A1. With bit E10 programmed high, the DQS preamble is programmed to a value different than the default value. The DQS preamble is set to a value that is a fraction of the default value. The fraction depends on the memory that is being programmed. The default, though also dependent on the memory being programmed, is typically one clock cycle of the memory.

In another embodiment, a data structure is used that is loaded into a register 304 of memory 300 of FIG. 3 other than a traditional mode register or an extended mode register. The data structure contains at least one bit that is used to program the DQS preamble to a default value or to a value different than the default value. One or more of the remaining bits in the data format are used to program the time length of a DQS preamble to a fraction of the default DQS preamble. In those situations where a DQS preamble longer than the default value is required, the format of the bits can be used to program a DQS preamble to a multiple of the default DQS preamble, such as a multiple of 1.1 or 1.25. Predominantly, the data structure will be used to program a reduced DQS preamble to a fraction of the clock cycle, a specified time length, or a default value reduced by a fixed time delay.

The format representing the data structure is stored in a controller such as controller 202 of FIG. 2 in some form of computer-readable medium as ROM or RAM. Controller 202 sets the bits according to the format of the data structure for programming the DQS preamble in a memory such as memory 300 of FIG. 3. Controller 202 is configured to output the necessary bits in the required format as part of an initialization sequence for the memory. Further, controller 202 is configured to provide a data signal for a memory 300 embodied in a set of electrical signals that includes data representing a time length for the DQS preamble of memory 300. These data signals can include signals representing the various embodiments of the data structure for programming the DQS preamble of memory 300. In one embodiment these data signal are provided on address bus 310 coupled to memory 300. Controller 202 also provides the control data signals to memory 300 to indicate that the information on address bus 310 is to be loaded into registers 304.

Margin Control

Figure 5:
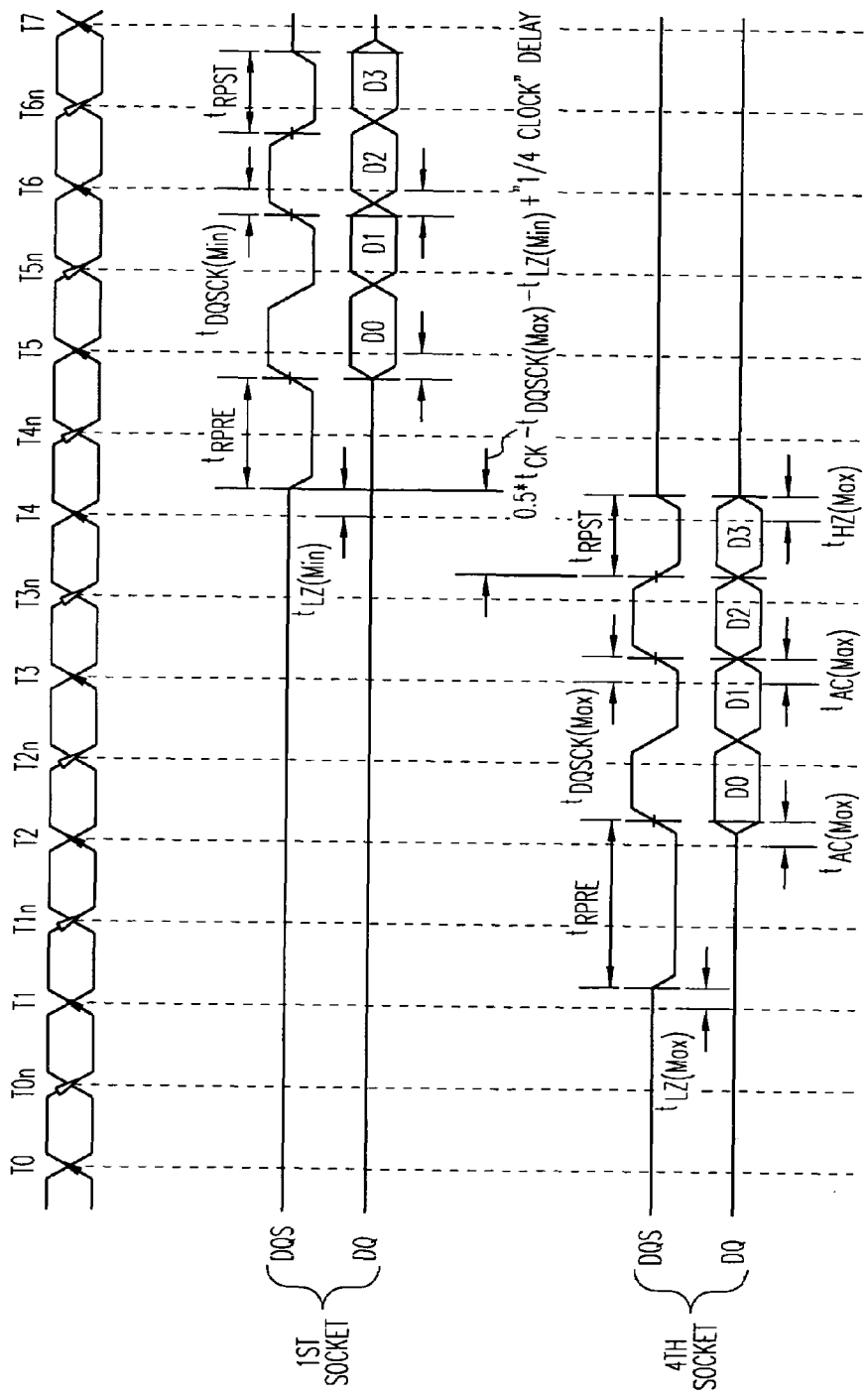
FIG. 5 shows a timing diagram of an embodiment of a fourth to first socket read operation, according to the teachings of the present invention.

FIG. 5 shows a timing diagram of an embodiment of a fourth to first socket read operation, according to the teachings of the present invention. This timing diagram demonstrates the control of the margin that is provided by a system using a controller for programming the DQS preamble for the memories to which the controller is coupled. In this embodiment, the memory of socket 4 is programmed with a default DQS preamble equal to one clock cycle, while the memory of socket 1 is programmed with a DQS preamble less than one clock cycle. Alternately, the memory of socket 4 is programmed to the same DQS preamble as the memory of socket 1, where a reduced DQS preamble is attained by delaying the beginning of the DQS preamble. Comparing FIG. 1 with FIG. 4, the timing remains the same for a memory in the $4^{th}$ socket. With a memory such as memory 300 located in the $1^{st}$ socket, the beginning of the reduced DQS preamble for a read operation is shifted from before clock period T4 to after clock period T4 and before clock period T4 n by a one-fourth clock delay. The subsequent margin is adjusted by the early time associated with $t_{LZ(min)}$ reduced by one-fourth clock cycle. This reflects the reduction of the favorable (best case) tolerance stack up. It is anticipated that a one-fourth clock delay programmed into memory 300 would at minimum produce a one-tenth delay of the clock cycle due to tolerance stack up. However, with a full one—quarter clock delay, the margin between a $4^{th}$ socket and a $1^{st}$ socket read operation can be summarized in the following table:

TABLE 3

Timing Margin for $4^{th}$ to $1^{st}$ Socket Read with a DQS Preamble with a ¼ clock delay

| clock | $t_{LZ(min)}$ | $t_{DQSCK(max)}$ | ½ $t_{Tmaxslew}$ | early | late | margin |
|---|---|---|---|---|---|---|
| 10 | 0.8 | 0.8 | 0.138 | −1.7 | 0.662 | 6.038 |
| 7.5 | 0.75 | 0.75 | 0.138 | −1.175 | 0.612 | 4.313 |
| 6 | 0.6 | 0.6 | 0.138 | −.9 | 0.462 | 3.438 |

Advantageously, the programming of a reduced DQS preamble provides acceptable margins as the system operating speeds increase.

Operation

Figure 6:
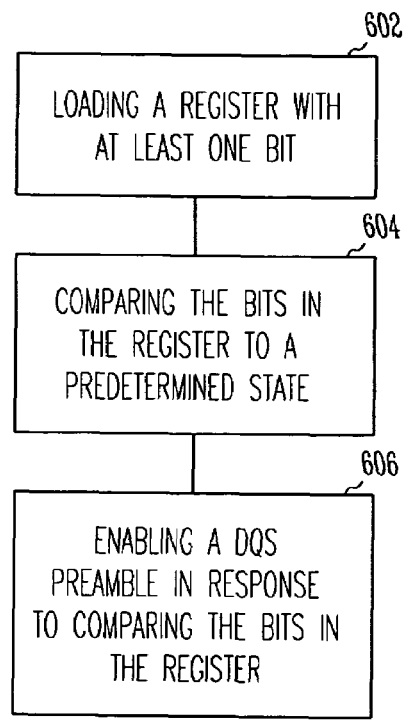
FIG. 6 shows a flow diagram of an embodiment of a method for programming a DQS preamble, according to the teachings of the present invention.

FIG. 6 shows a flow diagram of an embodiment of a method for programming a DQS preamble, according to the teachings of the present invention. Programming a DQS preamble in a memory such as memory 300 of FIG. 3 includes loading a register with at least one bit (at 602), comparing the bits in the register to a predetermined state (at 604), and enabling a DQS preamble in response to comparing the bits in the register (at 606). At 602, loading a register with at least one bit includes memory 300 identifying an input command for loading one or more registers 304 with bits input on address bus 310. In one embodiment, the bits are format on address bus 310 and loaded into registers 304 according to the data structure for an extended mode register of FIG. 4. Alternately, a register other than an extended mode register is loaded by memory 300 according to a predetermined format for a data structure containing the data for programming memory 300.

At 604, comparing the bits in the register to a predetermined state includes control logic 202 providing at least one bit from the registers 304 within control logic 302 to delay element 308 as an input to a logic gate of delay element 308. Alternately, control logic 302 compares one or more bits in registers 304 against a format having a predetermined state (0 or 1) for the set of bits. If the state of the bits match the predetermined format, control logic provides an input to delay element 308 for enabling the delay element to provide a delay to drivers 320. If the state of the one or more bits does not match the predetermined format, control logic 302 provides an input to delay element 308 for disabling, or not enabling, a delay. Disabling a delay from delay element 308 maintains or enables the DQS preamble to a default DQS preamble of one clock cycle. In one embodiment, comparing the bits in the register includes control logic 302 using the bits to generate a bit or signal indicating enabling a delay and generate one or more bits or signals indicating the time length of the delay.

At 606 enabling a DQS preamble in response to comparing the bits in the register includes enabling delay element 308 either to provide a delay to drivers 320, which reduces the DQS preamble to a time length less than a default DQS preamble or to provide no delay to drivers 320, which enables or maintains the default DQS preamble at one clock default. The enabled delay reduces the DQS preamble by delaying the beginning of the DQS preamble. In other embodiments, the default DQS preamble is a predetermined time length or a predetermined time length different than one clock cycle set in the memory.

Enabling a DQS preamble to a time length less than a default DQS preamble includes setting the DQS preamble to a fraction of a clock cycle, or a fraction of the default DQS preamble. Memory 300 can be configured using delay element 308 and delay lock loop 306 such that enabling the DQS preamble sets the DQS preamble to a fixed fraction of a clock cycle. As a result, memory 300 enables a reduced DQS preamble using one bit to enable or disable delay element 308. In another embodiment, the bits loaded in the register are used to determine the fraction of the clock cycle for setting the DQS preamble. In the various embodiments, the DQS preamble can be enabled to a time length reduced from a clock cycle by about one-fourth of the clock cycle, about one-half of the clock cycle, about three-fourths of the clock cycle, or about one-tenth of the clock cycle. It can be appreciated by those skilled in the art that the DQS preamble can be programmed to other fractions of a clock cycle, specified time lengths, fixed time delays less than a default value, or other fractions of the default preamble.

Loading one or more registers 304 can also include loading one of these registers with at least one bit that indicates selecting the DQS preamble greater than the default DQS preamble. With one or more bits indicating programming an increased DQS preamble, the DQS preamble is set to a multiple of the default DQS preamble. Alternately, the DQS preamble is set to a multiple of a clock cycle. The increased DQS preamble can be set to about one-fourth greater than the clock cycle, or about one-tenth greater than the clock cycle. It can be appreciated by those skilled in the art that the DQS preamble can be programmed to other multiples of a clock cycle, or other multiples of the default preamble.

Programming a DQS preamble is performed as part of an initialization sequence for the memory. The DQS is also programmed by memory 300 on receiving an appropriate command for loading the registers. A specific command is used for programming these registers since the data for the registers 304 is received over address bus 310 rather than data bus 312. In other embodiments, memory 300 is configured with registers receiving data from a data bus for programming a DQS preamble.

Figure 7:
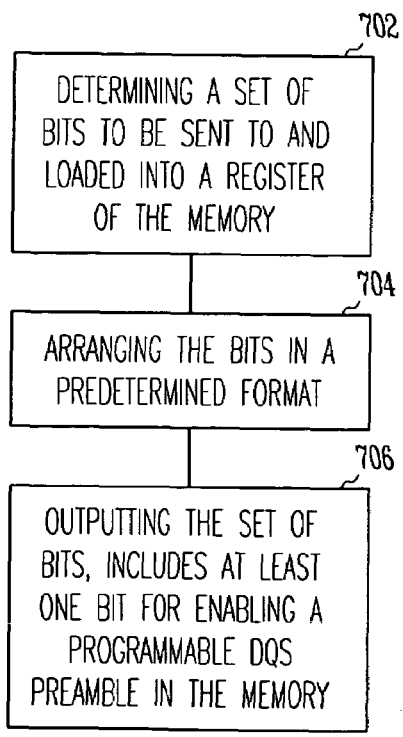
FIG. 7 shows a flow diagram of another embodiment of a method for programming a DQS preamble, according to the teachings of the present invention.

FIG. 7 shows a flow diagram of another embodiment of a method for programming a DQS preamble, according to the teachings of the present invention. A controller such as controller 202 of FIG. 2 programs one or more of the memory devices 204_1-204_n configured as memory 300 of FIG. 3 and located in slots 208_1-208_n of memory module 206 using a method that includes determining a set of bits to be sent to and loaded into a register of the memory (at 702), arranging the bits in a predetermined format (at 704), and outputting the set of bits (at 706). The set of bits output by controller 202 includes at least one bit for enabling a programmable DQS preamble in memory 300.

At 702, determining a set of bits to be sent to and loaded into one or more registers 304 of memory 300 includes providing a bit that indicates either enabling a DQS preamble different than a default DQS preamble, or enabling the default DQS preamble. Controller 202 provides at least one bit for enabling a DQS preamble to be set to a fraction of a clock cycle. In another embodiment, determining a set of bits to be sent to and loaded into one or more registers 304 of memory 300 includes providing bits for setting a time length for the DQS preamble.

At 704, arranging the bits in a predetermined format includes controller 202 placing the bits representing the desired state for programming the DQS of memory 300 in a format for loading an extended mode register of the one or more registers 304 with the bits to enable the DQS preamble to be set to the desired time length. Controller 202 provides the data structure of FIG. 4 on the address bus 310 with bit transferred on A10 set to a high for enabling a DQS less than the default DQS preamble, or set to a low for enabling the default DQS preamble. Alternately, the default DQS preamble can be enabled with a high bit, and a reduced DQS preamble enabled with a low bit. In another embodiment, controller 202 places bits into a format for a data structure that includes a data portion for enabling/disabling a default DQS preamble and a data portion for selecting the time length of the DQS preamble relative to the default DQS preamble or a clock cycle. Controller 202 can set the bits to enable the DQS preamble to a fraction or a multiple of the default DQS preamble or a clock cycle.

At 706, outputting the set of bits includes controller 202 generating a data signal for memory 300 embodied in a set of electrical signals including data representing a time length for a DQS preamble of the memory device including a data portion for enabling the DQS preamble. In one embodiment, the data portion is a bit enabling the DQS preamble such that the bit in a low state indicates the DQS preamble is a clock cycle and the bit in a high state indicates that the DQS preamble is reduced in time length from the clock cycle. Memory 300 is configured to reduce the DQS preamble to a fraction of the clock cycle, where the fraction is predetermined by the circuitry of memory 300 that uses the enable bit to activate the DQS reducing circuitry. Further, controller 202 also outputs signals representing data for providing memory 300 with a command to load one or more registers 304. In another embodiment, controller 202 outputs data signals to memory 300 in a set of electrical signals representing other embodiments of a data structure, as discussed above, for programming corresponding embodiments of memory 300.

In an embodiment, the instructions for controller 202 to program a DQS preamble in memory 300 are located in a computer-readable medium. Controller 202 is provided with instructions on determining or setting the set of bits to be sent to memory 300, and the set of bits to be loaded in memory 300. Controller 202 is also provided with instructions for the format in which the bits are to be arranged. Further, controller 202 is provided with instructions for outputting the set of bits to be used by memory 300. In addition, the computer-readable medium provides instructions for generating or retrieving parameters such as parameters for enabling/disabling the default DQS, or for providing the fraction or multiple of the default DQS preamble or clock cycle to which the DQS preamble is to be set. The computer readable medium can include memory within controller 202, memory that can be accessed by controller 202, memory providing initiation of the DQS preamble programming sequence to controller 202. This memory providing instructions for controller 202 can include any kind of memory such as diskettes, hard disks, CD-ROMS, flash ROMS, nonvolatile ROM, and RAM. Typically, this memory is activated on power-up of a system for initializing memories to be controlled by one or more processors of the system. Further, controller 202 may be a processor of the system or an intermediate device used for programming memory.

CONCLUSION

The above structures and methods have been described, by way of example, and not by way of limitation, with respect to providing a programmable data strobe (DQS) preamble for a memory.

A method and apparatus are provided for programming a DQS preamble in a memory by loading a defined set of bits into one or more registers of the memory, where one or more bits are formatted specifically for enabling the data strobe preamble. At least one of the bits is used to enable a data strobe preamble as either a default data strobe preamble of the memory or as a reduced data strobe preamble with a time length set equal to a fraction of the default preamble, a specified time length, a specified time lenght less than a default value, or a fraction of a clock cycle. A data strobe preamble is reduced by reducing a preamble window by delaying the beginning of the data strobe preamble. The enabling bit can be used to provide a input for generating a delay that provides a delayed signal to drivers of the memory that produce a reduced DQS preamble in conjunction with a signal from a DQS generator and that sequence or drive data to be read out of the memory. The reduced data strobe preamble can also be used for writing data into the memory.

Advantageously, programming a DQS preamble with a time length less than a clock cycle provides a means for increasing the margin of a system for reading from one memory and reading from another memory in which there is a electrical line length (length of time for a signal to propagate between one socket and the other socket) that is a significant portion of a system clock cycle. Increasing the margin by programming the DQS preamble of one or more memories allows the margin to be increased to or greater than the electrical line length. This increased margin allows the system the ability to manage the flow of data on its data bus and avoid conflicting use of the data bus by different memories.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic device comprising:
a register to store a number of bits; and
control logic to apply one or more bits stored in the register, the electronic device adapted to program a time length of a data strobe (DQS) preamble of the electronic device based on the one or more bits.

2. The electronic device of claim 1, wherein the electronic device includes a delay element to reduce the data strobe preamble to a shorter period than a default value for the data strobe preamble.

3. The electronic device of claim 1, wherein the electronic device is configured with one or more of the number of bits to enable a delay element.

4. The electronic device of claim 1, wherein the electronic device is configured to delay beginning the data strobe preamble to reduce the time length of the data strobe preamble.

5. An electronic device comprising:
a register having a number of bits;
control logic to apply one or more bits stored in the register, the electronic device adapted to program a time length of a data strobe (DQS) preamble of the electronic device based on the one or more bits;
a delay lock loop;
a delay element having a plurality of inputs and at least one output, one input coupled to the control logic, a second input coupled to the delay lock loop, wherein the control logic, the register, the delay lock loop, and the delay element are adapted to program the data strobe (DQS) preamble.

6. An electronic device comprising:
a register having a number of bits;
control logic that uses one or more bits of the register, the electronic device adapted to program a time length of a data strobe (DQS) preamble of the electronic device;
a delay lock loop;
a delay element having a plurality of inputs and at least one output, one input coupled to the control logic, a second input coupled to the delay lock loop, wherein the control logic, the register, the delay lock loop, and the delay element are adapted to program the data strobe (DQS) preamble;
a data strobe signal generator;
a driver having an input coupled to the data strobe signal generator and another input coupled to the delay element; and
a data signal line coupled as an output of the driver.

7. The electronic device of claim 5, wherein the register is configured to receive a set of bits, the set having at least one bit to enable the delay element.

8. The electronic device of claim 5, wherein the delay element is configured to provide a delay for setting a DQS preamble to a fraction of a clock signal.

9. The electronic device of claim 5, wherein the register is configured to receive a set of bits, the set having at least one bit to disable the delay element.

10. The electronic device of claim 5, wherein the control logic, the register, the delay lock loop, and the delay element are disposed in an integrated circuit.

11. An electronic device comprising:
a register to store a number of bits, the register being a mode register of a memory; and
control logic to apply one or more bits stored in the register, the electronic device adapted to program a time length of a data strobe (DQS) preamble of the electronic device based on the one or more bits.

12. The electronic device of claim 11, wherein one bit of the register is used to enable/disable a delay element.

13. The electronic device of claim 11, wherein the time length is a fraction of a clock cycle input to the memory.

14. The electronic device of claim 11, wherein the time length is reduced by a time delay from a default time length of the data strobe preamble in the memory.

15. The electronic device of claim 11, wherein the electronic device includes inputs to receive signals providing a data structure to load bits into the register.

16. The electronic device of claim 15, wherein the electronic device includes inputs to receive the signals from an address bus.

17. An electronic device comprising:
a mode register to store a number of bits;
control logic to apply one or more bits stored in the mode register, the electronic device adapted to program a time length of a data strobe (DQS) preamble of the electronic device based on the one or more bits; and
a delay element responsive to one or more bits in the mode register, wherein the delay element is configured to control the time length of the data strobe preamble.

18. The electronic device of claim 17, wherein the electronic device includes a delay lock loop, and the delay element has a plurality of inputs and at least one output, one input coupled to the control logic, a second input coupled to the delay lock loop.

19. An electronic device comprising:
a mode register having a number of bits;
control logic that uses one or more bits of the mode register, the electronic device adapted to program a time length of a data strobe (DQS) preamble of the electronic device;
a delay lock loop;
a delay element responsive to one or more bits in the mode register, wherein the delay element is configured to control the time length of the data strobe preamble, the delay element having a plurality of inputs and at least one output, one input coupled to the control logic, a second input coupled to the delay lock loop;
a data strobe signal generator;
a driver having an input coupled to the data strobe signal generator and another input coupled to the delay element; and
a data signal line coupled as an output of the driver.

20. The electronic device of claim 19, wherein the mode register, the control logic, the delay element, the delay lock loop, the data strobe signal generator, and the driver are disposed in an integrated circuit.

21. The electronic device of claim 17, wherein the mode register is configured to receive a set of bits, the set having at least one bit to enable the delay element.

22. The electronic device of claim 17, wherein the delay element is configured to provide a delay for setting a DQS preamble to a fraction of a clock signal.

23. The electronic device of claim 17, wherein the delay element is configured to provide a delay for setting a DQS preamble to three-fourths of a clock signal.

24. The electronic device of claim 17, wherein the mode register is configured to receive a set of bits, the set having at least one bit to disable the delay element.

25. An electronic device comprising:
a mode register having a number of bits;
control logic that uses one or more bits of the mode register, the electronic device adapted to program a time length of a data strobe (DQS) preamble of the electronic device; and
a delay element responsive to one or more bits in the mode register, wherein the delay element is configured to control the time length of the data strobe preamble, wherein the electronic device includes a memory having an extended mode register to hold bits to program the time length of the data strobe (DQS) preamble.

26. The electronic device of claim 5, wherein the electronic device includes:
a data strobe signal generator;
a driver having an input coupled to the data strobe signal generator and another input coupled to the delay element; and
a data signal line coupled as an output of the driver.

27. The electronic device of claim 18, wherein the electronic device includes:
a data strobe signal generator;
a driver having an input coupled to the data strobe signal generator and another input coupled to the delay element; and
a data signal line coupled as an output of the driver.

28. The electronic device of claim 27, wherein the mode register, the control logic, the delay element, the delay lock loop, the data strobe signal generator, and the driver are disposed in an integrated circuit.

29. The electronic device of claim 17, wherein the electronic device includes a memory having an extended mode register to hold bits to program the time length of the data strobe (DQS) preamble.

* * * * *

UNITED STATES PATENT AND TRADEMARK OFFICE
CERTIFICATE OF CORRECTION

PATENT NO. : 7,330,382 B2 Page 1 of 1
APPLICATION NO. : 10/929282
DATED : February 12, 2008
INVENTOR(S) : Schaefer It is certified that error appears in the above-identified patent and that said Letters Patent is hereby corrected as shown below:

In column 12, line 20, in Claim 5, delete "having" and insert -- to store --, therefor.

In column 12, line 25, in Claim 5, after "loop;" insert -- and --.

Signed and Sealed this

Twentieth Day of May, 2008

JON W. DUDAS
*Director of the United States Patent and Trademark Office*